(12) United States Patent
Seo et al.

(10) Patent No.: US 8,455,869 B2
(45) Date of Patent: Jun. 4, 2013

(54) OXIDE THIN FILM TRANSISTOR AND METHOD OF FABRICATING THE SAME

(75) Inventors: Hyun-Sik Seo, Goyang (KR); Jong-Uk Bae, Seoul (KR); Dae-Hwan Kim, Paju (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/463,222

(22) Filed: May 3, 2012

(65) Prior Publication Data

US 2012/0261660 A1    Oct. 18, 2012

Related U.S. Application Data

(62) Division of application No. 12/548,908, filed on Aug. 27, 2009, now Pat. No. 8,187,919.

(30) Foreign Application Priority Data

Oct. 8, 2008  (KR) .......................... 10-2008-0098819
Oct. 8, 2008  (KR) .......................... 10-2008-0099814

(51) Int. Cl.
     *H01L 29/786*     (2006.01)
(52) U.S. Cl.
     USPC .............. 257/43; 257/E29.296; 257/E21.411; 438/104
(58) Field of Classification Search
     USPC .............. 257/43, E29.296, E21.411; 438/104
     See application file for complete search history.

(56) References Cited

U.S. PATENT DOCUMENTS

2007/0108446 A1     5/2007  Akimoto
2008/0299702 A1*   12/2008  Son et al. ...................... 438/104
2009/0186445 A1*    7/2009  Akimoto ....................... 438/104

FOREIGN PATENT DOCUMENTS

KR    1020070107297 A    11/2007
KR    10-2008-0070811     7/2008
KR    10-2008-0087744    10/2008

OTHER PUBLICATIONS

Office Action issued in corresponding Korean Patent Application No. 10-2008-0098819, mailed Feb. 6, 2013.
Office Action issued in corresponding Korean Patent Application No. 10-2008-0099814, mailed Feb. 6, 2013.

* cited by examiner

*Primary Examiner* — Zandra Smith
*Assistant Examiner* — Paul Patton
(74) *Attorney, Agent, or Firm* — Brinks Hofer Gilson & Lione

(57) ABSTRACT

An oxide thin film transistor (TFT) and its fabrication method are disclosed. In a TFT of a bottom gate structure using amorphous zinc oxide (ZnO)-based semiconductor as an active layer, source and drain electrodes are formed, on which the active layer made of oxide semiconductor is formed to thus prevent degeneration of the oxide semiconductor in etching the source and drain electrodes.

9 Claims, 6 Drawing Sheets

OXIDE THIN FILM TRANSISTOR AND METHOD OF FABRICATING THE SAME

The present patent document is a divisional of U.S. patent application Ser. No. 12/548,908, filed Aug. 27, 2009 now U.S. Pat. No. 8,187,919, which claims priority to Korean Patent Application No. 10-2008-0098819 filed in Korea on Oct. 8, 2008 and Korean Patent Application No. 10-2008-0099814 filed in Korea on Oct. 8, 2008, which is hereby incorporated by reference.

BACKGROUND

1. Field of the Invention

The present disclosure relates to an oxide thin film transistor and its fabrication method, and more particularly, to an oxide thin film transistor having a bottom gate structure using amorphous zinc oxide-based semiconductor as an active layer and its fabrication method.

2. Discussion of the Related Art

As consumer interest in information displays is growing and the demand for portable (mobile) information devices is increasing, research and commercialization of light and thin flat panel displays ("FPD"), which substitute cathode ray tubes (CRTs), the conventional display devices, has increased. Among FPDs, the liquid crystal display ("LCD") is a device for displaying images by using optical anisotropy of liquid crystal. LCD devices exhibit excellent resolution, color display and picture quality, so they are commonly used for notebook computers or desktop monitors, and the like.

The LCD includes a color filter substrate, an array substrate and a liquid crystal layer formed between the color filter substrate and the array substrate.

An active matrix (AM) driving method commonly used for the LCD is a method in which liquid crystal molecules in a pixel part are driven by using amorphous silicon thin film transistors (a-Si TFTs) as switching elements.

The structure of a general LCD will now be described in detail with reference to FIG. 1.

FIG. 1 is an exploded perspective view showing a general LCD device.

As shown in FIG. 1, the LCD includes a color filter substrate 5, an array substrate 10 and a liquid crystal layer 30 formed between the color filter substrate 5 and the array substrate 10.

The color filter substrate 5 includes a color filter (C) including a plurality of sub-color filters 7 that implement red, green and blue colors, a black matrix 6 for dividing the sub-color filters 7 and blocking light transmission through the liquid crystal layer 30, and a transparent common electrode 8 for applying voltage to the liquid crystal layer 30.

The array substrate 10 includes gate lines 16 and data lines 17 which are arranged vertically and horizontally to define a plurality of pixel areas (P), TFTs (T), switching elements, formed at respective crossings of the gate lines 16 and the data lines 17, and pixel electrodes 18 formed on the pixel areas (P).

The color filter substrate 5 and the array substrate 10 are attached in a facing manner by a sealant (not shown) formed at an edge of an image display region to form a liquid crystal panel, and the attachment of the color filter substrates 5 and the array substrate 10 is made by an attachment key formed on the color filter substrate 5 or the array substrate 10.

The above-described LCD is a display device receiving much attention so far with its advantages of being light and consuming a small amount of power. However, it is a light receiving device, not a light emitting device, and has a technical limitation with respect to brightness, a contrast ratio, a viewing angle, and the like. Thus, development of a new display device that can overcome such shortcomings is actively ongoing.

An organic light emitting diode (OLED), one of new flat panel display devices, is self-emissive, having good viewing angle and contrast ratio compared with the LCD. Because it does not need a backlight, it can be formed to be lighter and thinner, and is advantageous in terms of power consumption. Also, the OLED is driven at a low DC voltage and has a fast response speed. In particular, the OLED is advantageous in terms of fabrication costs.

Research for a large-scale organic light emitting display is actively ongoing, and development of a transistor achieving a stable operation and durability by securing constant current characteristics as a driving transistor of the OLED is required.

The amorphous silicon thin film transistor used for the above-described LCD may be fabricated in a low temperature process, but it mobility is very small and does not satisfy constant current bias conditions. Meanwhile, a polycrystalline silicon thin film transistor has high mobility and satisfies the constant current bias conditions, but it is difficult to secure uniform characteristics, so it is difficult to increase in area and a high temperature process is required.

Thus, an oxide semiconductor thin film transistor including an active layer as oxide semiconductor has been developed, but application of the oxide semiconductor to the thin film transistor of the conventional bottom gate structure causes degeneration of the oxide semiconductor during an etching process of source and drain electrodes.

FIG. 2 is a sectional view schematically showing the structure of a general oxide thin film transistor.

As illustrated, a gate electrode 21 and a gate insulating layer 15 are formed on the oxide thin film transistor of the bottom gate structure, and an active layer 24 formed of oxide semiconductor is formed on the gate insulating layer 15.

Thereafter, source and drain electrodes 22 and 23 are formed on the active layer 24, and at this time, in the process of depositing and etching the source and drain electrodes 22 and 23, the lower active layer 24 (in particular, a portion 'A') is possibly damaged to be degenerated, deteriorating the reliability of the device.

Namely, when the source and drain electrodes are formed according to a wet etching, the active layer is lost or damaged due to the physical properties of the oxide semiconductor which is weak to an etchant. Also, even when the source and drain electrodes are formed according to a dry etching, back sputtering or oxygen deficiency of the oxide semiconductor causes the active layer to be degenerated.

Although not shown, a protection layer (passivation layer) made of silicon oxide film is formed by using a plasma enhanced chemical vapor deposition (PECVD) equipment, and in this case, in the oxide semiconductor constituting the active layer, hydrogen atoms serve as a carrier within the semiconductor thin film by a reaction with H2 gas while the PECVD silicon oxide film is deposited, making the oxide semiconductor changed to a conductor.

Thus, in place of the single protection layer of the silicon oxide film, a dual structure in which an etch stopper that restrains a reaction with H2 gas is additionally formed on the active layer is employed, which, however, has a complicated process and incurs high cost. In addition, when the protection layer of the dual structure is formed by adjusting a rate of flow of the H2 gas of the reaction gas, particles are generated due to precipitation of silicon atoms, disadvantageously narrowing a process window.

BRIEF SUMMARY

An oxide thin film transistor (TFT) includes: a gate electrode form on a substrate; a gate insulating layer formed on the gate electrode; source and drain electrodes formed on the gate insulating layer and having a multi-layer structure of two or more layers; and an active layer formed on the source and drain electrodes and formed of amorphous zinc oxide-based semiconductor, wherein a metal layer such as indium-tin-oxide, molybdenum, and the like, having good ohmic-contact characteristics with titanium and a titanium alloy having good bonding force with oxygen or the oxide-based semiconductor is formed at an uppermost portion of the source and drain electrodes.

A method for fabricating an oxide thin film transistor, including: forming a gate electrode on a substrate; forming a gate insulating layer on the substrate; forming source and drain electrodes on the gate insulating layer; and forming an active layer made of amorphous zinc oxide-based semiconductor at an upper portion of the source and drain electrodes.

A method for fabricating an oxide thin film transistor, including: forming a gate electrode on a substrate; forming a gate insulating layer on the gate electrode; 1 forming an active layer made of amorphous zinc oxide-based semiconductor on the gate insulating layer; forming source and drain electrodes electrically connecting with a certain region of the active layer on the substrate with the active layer formed thereon; forming a first protection layer formed of silicon nitride film by injecting only $N_2$ gas by using a stopper equipment on the substrate with the source and drain electrodes formed thereon, the first protection layer having a thickness of 100 Å to 400 Å; and forming a second protection layer on the first protection layer.

It is to be understood that both the foregoing general description and the following detailed description are exemplary and explanatory and are intended to provide further explanation of embodiments as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE DRAWINGS AND THE PRESENTLY PREFERRED EMBODIMENTS

An oxide thin film transistor (TFT) according to exemplary embodiments of the present disclosure will now be described in detail with reference to the accompanying drawings.

Figure 1:
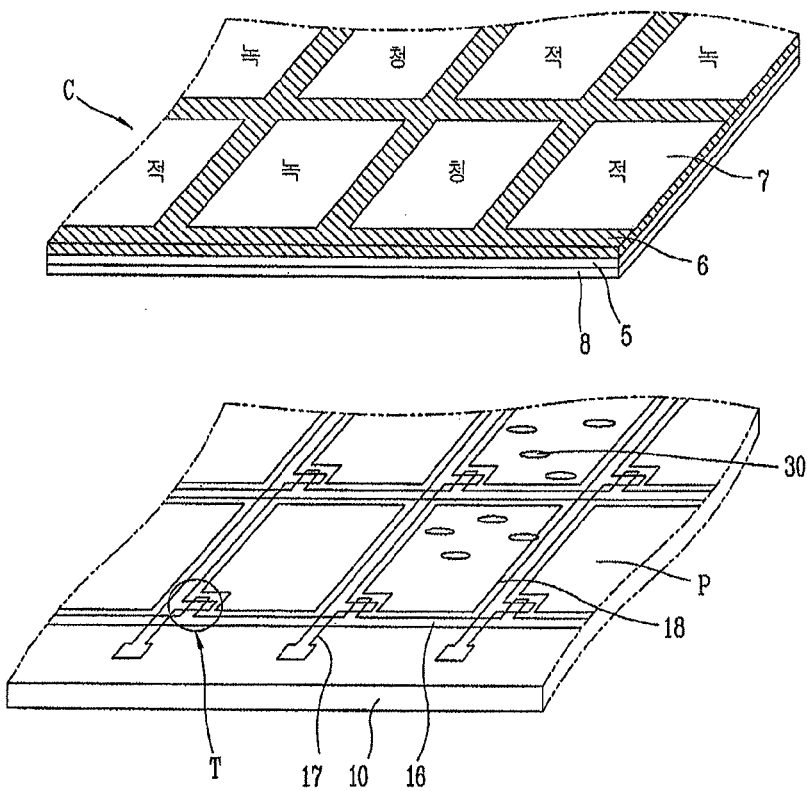
FIG. 1 is an exploded perspective view schematically showing a general liquid crystal display (LCD) device.
Figure 2:
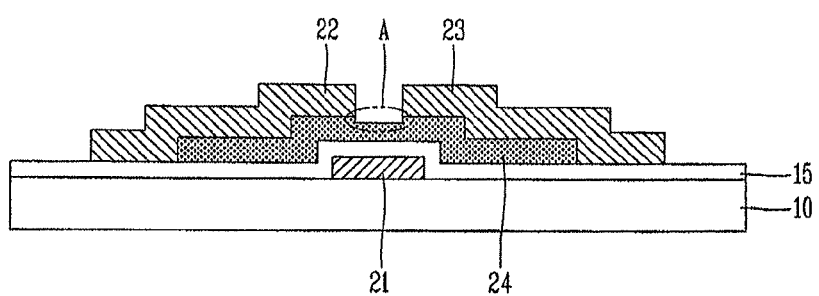
FIG. 2 is a sectional view schematically showing the structure of a general oxide thin film transistor.
Figure 3:
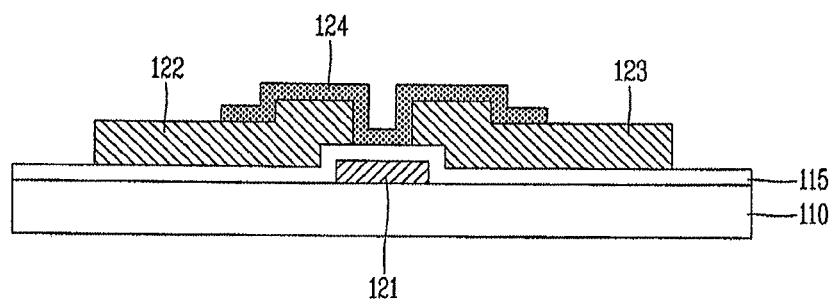
FIG. 3 is a sectional view schematically showing the structure of an oxide thin film transistor (TFT) according to a first embodiment.

FIG. 3 is a sectional view schematically showing the structure of an oxide thin film transistor (TFT) according to a first embodiment of the present disclosure. Specifically, FIG. 3 shows the structure an oxide TFT using amorphous zinc oxide-based semiconductor as an active layer.

As illustrated, the oxide TFT according to a first embodiment of the present disclosure includes a gate electrode 121 formed on a certain substrate 110, a gate insulating layer 115 formed on the gate electrode 121, source and drain electrodes 122 and 123 formed on the gate insulating layer 115, and an active layer 124 made of amorphous zinc oxide-based semiconductor and electrically connected with the source and drain electrodes 122 and 123.

In the oxide TFT according to the first embodiment of the present disclosure, because the active layer 124 is formed by using amorphous zinc oxide-based semiconductor, high mobility and constant current test conditions are met, and uniform characteristics are secured, so the oxide TFT can be applicable to a large-scale display.

The zinc oxide (ZnO) is a material that can implement three qualities of conductivity, semiconductor characteristics and resistance according to content of oxygen, so the oxide TFT employing the amorphous zinc oxide-based semiconductor material as the active layer 124 can be applicable to a large-scale display including an LCD device and an organic electroluminescence display.

Recently, enormous interests and activities are concentrated on a transparent electronic circuit, and the oxide TFT employing the amorphous zinc oxide-based semiconductor material as the active layer 124 has the high mobility and can be fabricated at a low temperature, so it can be employed for the transparent electronic circuit.

In particular, in the oxide TFT according to the first embodiment of the present invention, the active layer 124 is formed with a-IGZO semiconductor containing heavy metal such as indium (In) and gallium (Ga) in ZnO.

The a-IGZO semiconductor is transparent, allowing visible ray to transmit therethrough, and the oxide TFT fabricated with the a-IGZO semiconductor has mobility of 1~100 $cm^2Ns$, exhibiting high mobility characteristics compared with the amorphous silicon TFT.

In addition, the a-IGZO semiconductor has wide band gap and can be used for fabricating a UV light emitting diode (LED) having high color purity, a white LED and other components. Also, because it can be processed at a low temperature, a light and flexible product can be manufactured.

Moreover, the oxide TFT fabricated with the a-IGZO semiconductor has uniform characteristics similar to that of the amorphous silicon TFT, so its component structure is simple like the amorphous silicon TFT and thus, the oxide TFT can be applicable to a large-scale display.

In the oxide TFT having such characteristics according to the first embodiment of the present invention, a carrier density of the active layer 124 can be adjusted by adjusting an oxygen density in a reactive gas during sputtering, to thereby adjust device characteristics of the TFT.

In addition, in the oxide TFT according to the first embodiment of the present invention, after the source and drain electrodes 122 and 123 are formed, the a-IGZO oxide semiconductor is deposited to form the active layer 124, thus basically solving a degeneration problem of the oxide semiconductor generated in etching the source and drain electrodes as mentioned above.

Also, because an etching process of the source and drain electrodes can be freely applied without any limitation, the source and drain electrodes can be formed as a dual-layer to improve ohmic-contact characteristics between the oxide semiconductor and the source and drain electrodes. This will now be described in detail in a second embodiment of the present invention.

Figure 4:
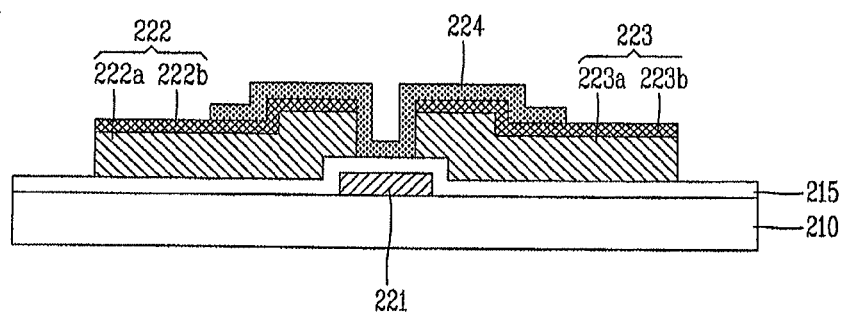
FIG. 4 is a sectional view schematically showing the structure of an oxide thin film transistor (TFT) according to a second embodiment.

FIG. 4 is a sectional view schematically showing the structure of an oxide thin film transistor (TFT) according to a second embodiment of the present invention. The oxide TFT according to the second embodiment of the present invention includes the same elements as those of the oxide TFT of the first embodiment of the present invention, except that the source and drain electrodes are configured as a dual-layer.

As shown in FIG. 4, the oxide TFT according to a second embodiment of the present disclosure includes a gate electrode 221 formed on a certain substrate 210, a gate insulating layer 215 formed on the gate electrode 221, source and drain electrodes 222 and 223 formed on the gate insulating layer 215, and an active layer 224 made of amorphous zinc oxide-based semiconductor and electrically connected with the source and drain electrodes 222 and 223.

In the oxide TFT according to the second embodiment of the present disclosure, because the active layer 224 is formed by using amorphous zinc oxide-based semiconductor like the oxide TFT according to the first embodiment of the present invention, high mobility and constant current test conditions are met, and uniform characteristics are secured, so the oxide TFT can be applicable to a large-scale display.

In particular, in the oxide TFT according to the second embodiment of the present invention, the active layer 224 is formed with a-IGZO semiconductor containing heavy metal such as indium (In) and gallium (Ga) in ZnO.

In the oxide TFT having such characteristics according to the second embodiment of the present invention, a carrier density of the active layer 224 can be adjusted by adjusting an oxygen density in a reactive gas during sputtering, to thereby adjust device characteristics of the TFT.

In addition, in the oxide TFT according to the second embodiment of the present invention, after the source and drain electrodes 222 and 223 are formed, the a-IGZO oxide semiconductor is deposited to form the active layer 224, thus basically solving a degeneration problem of the oxide semiconductor generated in etching the source and drain electrodes as mentioned above.

In particular, the source and drain electrodes 222 and 223 are formed as a dual-layer to improve ohmic-contact characteristics between the oxide semiconductor, namely, the active layer 224, and the source and drain electrodes. The source and drain electrodes 222 and 223 includes first source and drain electrodes 222a and 223a contacting with the gate insulating layer 215 and second source and drain electrodes 222b and 223b formed on the first source and drain electrodes 222a and 223a and contacting with the active layer 224.

The second source and drain electrodes 222b and 223b directly contacting with the active layer 224 may be made of metal such as titanium (Ti) or a Ti alloy having good bonding force with oxygen or indium tin oxide (ITO), molybdenum, and the like, having good ohmic-contact characteristics with the a-IGZO oxide semiconductor. This will now be described in detail through a method for fabricating an oxide TFT as follows.

Figure 5A:
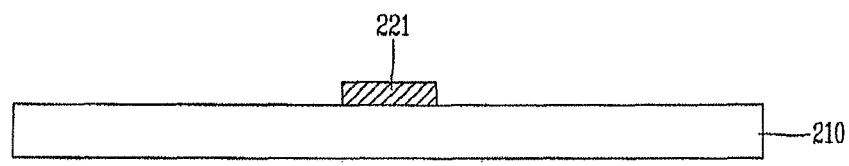
FIGS. 5A to 5C are sectional views sequentially showing a fabrication process of the oxide TFT of FIG. 4.
Figure 5B:
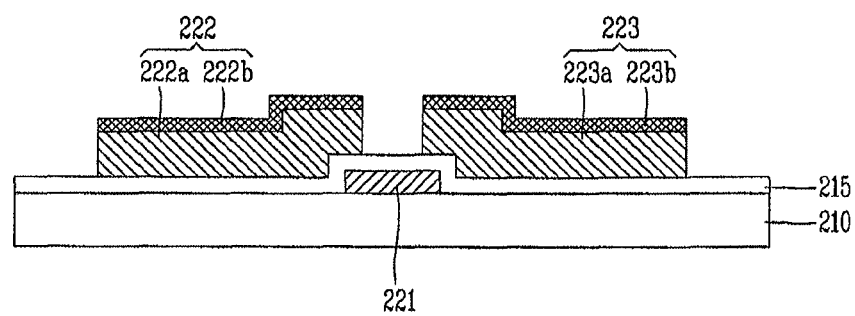
Figure 5C:
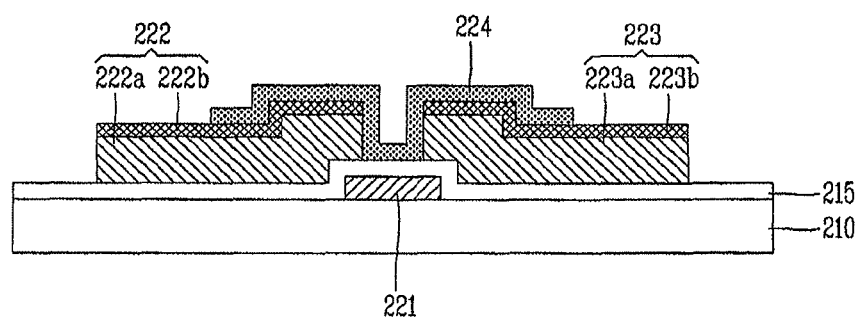

FIGS. 5A to 5C are sectional views sequentially showing a fabrication process of the oxide TFT of FIG. 4.

As shown in FIG. 5A, the gate electrode 221 is formed on the substrate 210 made of a transparent insulating material.

In this case, amorphous zinc oxide-based composite semiconductor applied to the oxide TFT according to the present disclosure can be deposited at a low temperature, so it can be used for a plastic substrate or the substrate 210 that can be applicable to a low temperature process such as soda lime glass and the like. In addition, because the amorphous zinc oxide-based composite semiconductor has amorphous characteristics, it can be used for the large-scale display substrate 210.

The gate electrode 221 is formed by depositing a first conductive film on the entire surface of the substrate 210 and selectively patterning it via a photolithography process (first masking process).

Here, the first conductive film can be made of a low-resistance opaque conductive material such as aluminum (Al), an aluminum alloy, tungsten (W), copper (Cu), nickel (Ni), chromium (Cr), molybdenum (Mo), titanium (Ti), platinum (Pt), tantalum (Ta), or the like. Also, the first conductive film may be made of an opaque such as ITO, indium zinc oxide (IZO), and the like, or may be formed with a multi-layered structure by stacking two or more conductive materials.

As shown in FIG. 5B, an inorganic insulating layer such as a silicon nitride film (SiNx), silicon oxide film ($SiO_2$) and the like is formed or the gate insulating layer 215 made of high dielectric oxide film such as hafnium (Hf) oxide or aluminum oxide is formed on the entire surface of the substrate 210 with the gate electrode 221 formed thereon.

The gate insulating layer 215 may be formed through a chemical vapor deposition (CVD) or a plasma enhanced chemical vapor deposition (PECVD).

The second conductive film may be used regardless of types of metals to form the source and drain electrodes 222a and 223a on the gate insulating layer 215, and the third conductive layer may be made of titanium or titanium alloy having good bonding force with oxygen or metal such as ITO, molybdenum, or the like, having good ohmic-contact characteristics with the a-IGZO oxide semiconductor. The source and drain electrodes 222 and 223 may be formed to have a multi-layered structure of dual or more layers.

With reference to FIG. 5C, amorphous zinc oxide-based semiconductor is deposited on the entire surface of the substrate 210 with the source and drain electrodes 222 as a dual-layer formed thereon to form a certain amorphous zinc oxide-based semiconductor layer, which is then selectively patterned through a photolithography process (third masking process) to form the active layer 224 electrically connecting with the second source and drain electrodes 222b and 223b.

In this case, the amorphous zinc oxide-based composite semiconductor, particularly, the a-IGZO semiconductor may be formed according to sputtering by using a composite target of gallium oxide ($Ga_2O_3$), indium oxide ($In_2O_3$) and zinc oxide (ZnO), and besides, it can be formed by using the CVD, atomic layer deposition (ALD), and the like.

In addition, the amorphous zinc oxide-based semiconductor layer, i.e., the a-IGZO, may be formed by using a composite oxide target having atom ratios of 1:1:1, 2:2:1, 3:2:1, 4:2:1, etc. of gallium, indium, and zinc.

Here, in the oxide TFT according to the present invention, a carrier density of the active layer 224 can be adjusted by adjusting an oxygen density in a reactive gas during sputtering to form the amorphous zinc oxide-based semiconductor layer, and at this time, uniform device characteristics can be obtained under conditions that oxygen density is about 1% to about 20% and the thickness is about 500 Å to about 1000 Å.

Figure 6:
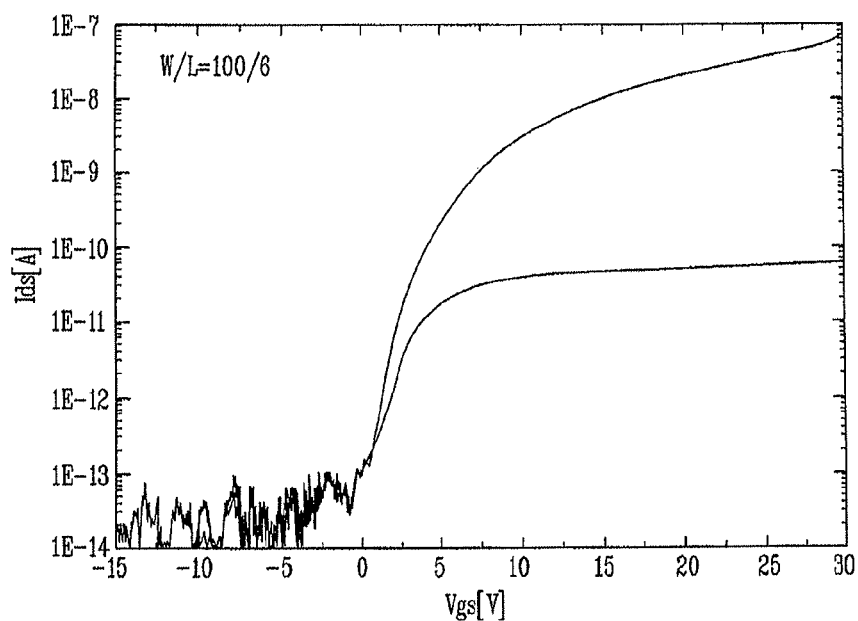
FIG. 6 is a graph of transfer characteristics of the oxide TFT according to the second embodiment.

FIG. 6 is a graph of transfer characteristics of the oxide TFT according to the second embodiment of the present invention, in which transfer characteristics of a-GIZO semiconductor TFTs with a channel region with a width of 100 μm and a length of 6 μm.

The graph of the transfer characteristics of the oxide TFT according to the second embodiment of the present invention shows drain currents according to the change (−15V~30V) in the gate voltage while the drain voltages are maintained as 0.1V and 10V.

As shown in FIG. 6, it is noted that the oxide TFT according to the second embodiment of the present invention has a higher on-current and high mobility characteristics with a steep slope compared with the amorphous silicon TFT.

In particular, as for the oxide TFTs according to the first and second embodiments of the present invention, because the active layer made of oxide semiconductor is prevented from being damaged when the source and drain electrodes are formed, the on-current and slope characteristics are further improved. In addition, the oxide TFT according to the second embodiment of the present invention includes the source and drain electrodes formed as a dual-layer, improving the ohmic-contact characteristics between the active layer and the source and drain electrodes. Thus, excellent device characteristics can be obtained.

Figure 7:
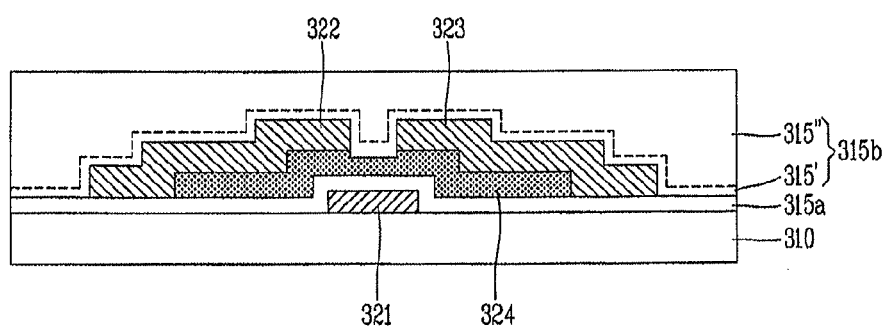
FIG. 7 is a sectional view schematically showing the structure of an oxide thin film transistor (TFT) according to a third embodiment.

FIG. 7 is a sectional view schematically showing the structure of an oxide thin film transistor (TFT) according to a third embodiment of the present invention, showing an oxide TFT structure in which a silicon nitride film is deposited by using a sputter equipment without $H_2$ gas and used as a protection layer of the oxide semiconductor.

As shown in FIG. 7, the oxide TFT according to a third embodiment of the present invention includes a gate electrode 321 formed on a certain substrate 310, a gate insulating layer 315a formed on the gate electrode 321, an active layer 324 formed as amorphous zinc oxide-based semiconductor on the gate insulating layer 315a, source and drain electrodes 322 and 323 electrically connecting with a certain region of the active layer 324, and a protection layer 315b having a dual-structure formed on the source and drain electrodes 322 and 323.

The protection layer 315b of the dual-structure according to the third embodiment of the present invention has the dual-structure of a first protection layer 315' formed by depositing only nitrogen ($N_2$) gas by using the sputter equipment and a second protection layer 315" deposited by adding an inert gas such as a small amount of argon (Ar) gas to increase a deposition speed.

At this time, in the oxide TFT according to the third embodiment of the present invention, because the active layer 324 is formed by using amorphous zinc oxide-based semiconductor like the oxide TFT according to the first embodiment of the present invention, high mobility and constant current test conditions are met, and uniform characteristics are secured, so the oxide TFT can be applicable to a large-scale display.

In particular, in the oxide TFT according to the third embodiment of the present disclosure, the active layer 324 is formed with a-IGZO semiconductor containing heavy metal such as indium (In) and gallium (Ga) in ZnO.

In the oxide TFT having such characteristics according to the third embodiment of the present invention, a carrier density of the active layer 324 can be adjusted by adjusting an oxygen density in a reactive gas during sputtering, to thereby adjust device characteristics of the TFT.

In addition, in the oxide TFT having such characteristics according to the third embodiment of the present disclosure, in order to solve the problem of degradation of the oxide semiconductor due to $H_2$ gas while the PECVD $SiO_2$ is deposited as described above, the protection layer 315b is formed to have the dual-structure including the first protection layer 315' formed by depositing only $N_2$ gas by using the sputter equipment and the second protection layer 315" deposited by adding an inert gas such as a small amount of Ar gas to increase a deposition speed. This will now be described in detail through a method for fabricating an oxide TFT as follows.

FIGS. 8A to 8E are sectional views sequentially showing a fabrication process of the oxide TFT of FIG. 7.

Figure 8A:
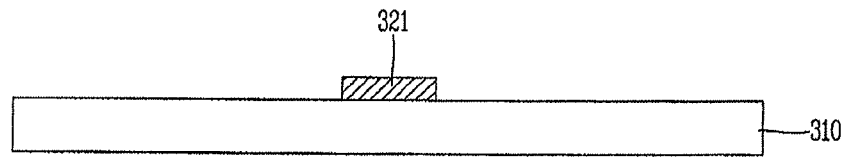
FIGS. 8A to 8E are sectional views sequentially showing a fabrication process of the oxide TFT of FIG. 7.

As shown in FIG. 8A, the certain gate electrode 321 is formed on the substrate 310 made of a transparent insulating material.

The gate electrode 321 is formed by depositing a first conductive film on the entire surface of the substrate 310 and selectively patterning it via a photolithography process (first masking process).

Here, the first conductive film can be made of a low-resistance opaque conductive material such as aluminum (Al), an aluminum alloy, tungsten (W), copper (Cu), nickel (Ni), chromium (Cr), molybdenum (Mo), titanium (Ti), platinum (Pt), tantalum (Ta), or the like. Also, the first conductive film may be made of an opaque such as ITO, indium zinc oxide (IZO), and the like, or may be formed with a multi-layered structure by stacking two or more conductive materials.

Figure 8B:
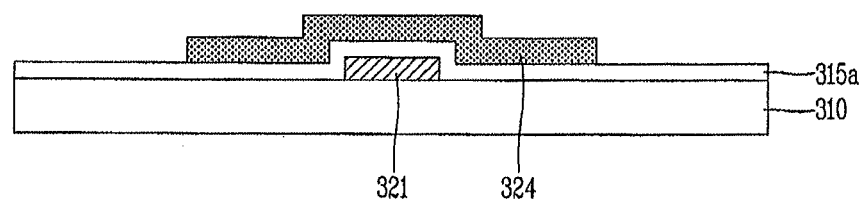

As shown in FIG. 8B, an inorganic insulating layer such as a silicon nitride film (SiNx), silicon oxide film ($SiO_2$) and the like is formed or the gate insulating layer 315a made of high dielectric oxide film such as hafnium (Hf) oxide or aluminum oxide is formed on the entire surface of the substrate 310 with the gate electrode 321 formed thereon.

The amorphous zinc oxide-based semiconductor is deposited on the entire surface of the substrate 310 with the gate insulating layer 315a formed thereon to form the certain amorphous zinc oxide-based semiconductor layer, which is then selectively patterned through a photolithography process (second masking process) to form the active layer 324 made of the amorphous zinc oxide-based semiconductor on the gate electrode 321.

In this case, the amorphous zinc oxide-based semiconductor layer, i.e., the a-IGZO, may be formed by using a composite oxide target having atom ratios of 1:1:1, 2:2:1, 3:2:1, 4:2:1, etc. of gallium, indium, and zinc.

Here, in the oxide TFT according to the third embodiment of the present invention, a carrier density of the active layer 324 can be adjusted by adjusting an oxygen density in a reactive gas during sputtering to form the amorphous zinc oxide-based semiconductor layer, and at this time, uniform device characteristics can be obtained under the condition that oxygen density is 1% to 20%.

Figure 8C:
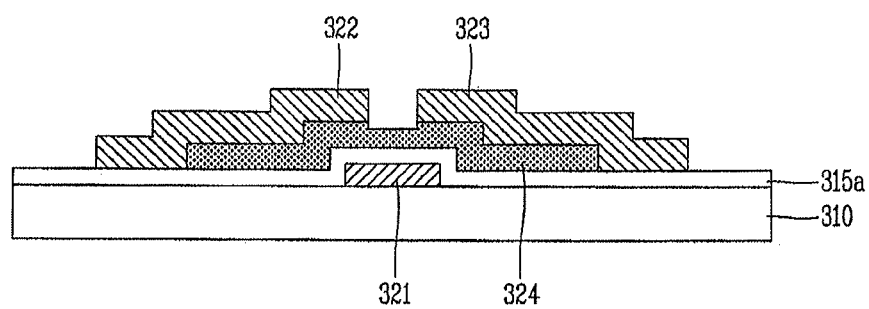

As shown in FIG. 8C, the second conductive layer is formed on the entire surface of the substrate 310 with the active layer 324 formed thereon and selectively patterned through a photolithography process (third masking process) to form the source and drain electrodes 322 and 323 formed of the second conductive film and electrically connecting with the source and drain electrodes of the active layer 324 on the active layer 324.

Figure 8D:
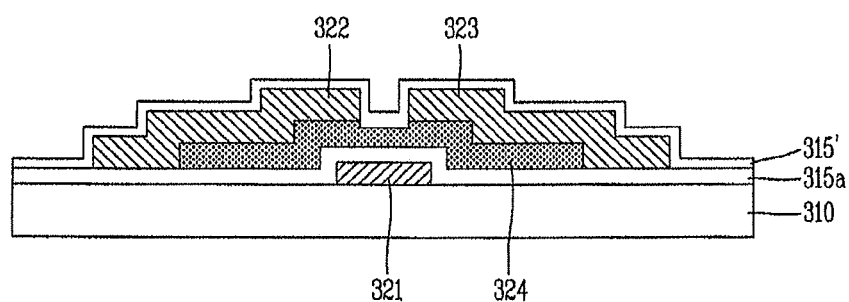

As shown in FIG. 8D, the first protection layer 315' formed of the silicon nitride film is formed with a thickness of about 100 Å to about 1000 Å (preferably, about 100 Å to about 400 Å) by using the sputter equipment.

In this case, the first protection layer 315' positioned on the active layer 324 serves to protect a back channel of the active layer 324, and by depositing it by injecting only $N_2$ gas during sputtering by using silicon target, degradation of the oxide semiconductor due to $H_2$ or Ar gas can be prevented during a process.

At this time, in order to improve uniformity of the deposited first protection layer 315', a nozzle does not jet $N_2$ gas directly to cathode but jets it to a wall surface of the sputter chamber so as to be reflected and introduced to the cathode.

Figure 8E:
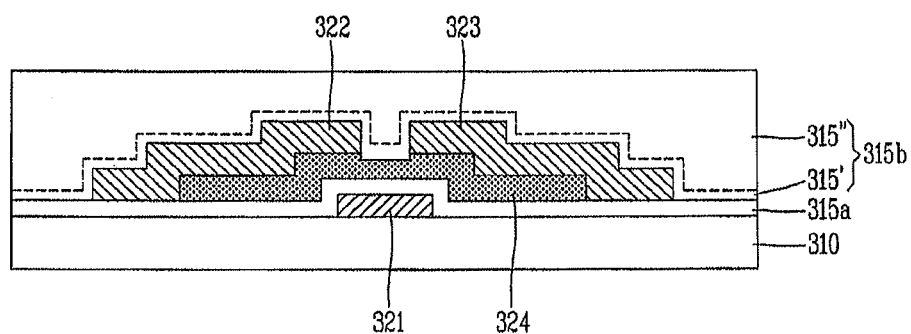

Thereafter, as shown in FIG. 8E, during the sputtering, an inert gas such as Ar gas is injected additionally to form the second protection layer 315" formed of the silicon nitride film on the first protection layer 315' at a low power level. In this embodiment, sputtering is performed at a low power level to form the second protection layer 315", but the present invention is not limited thereto and the sputtering may be performed at a high power level to increase the deposition speed.

For the second protection layer 315", the inert gas such as $N_2$ gas and Ar gas are used, so the deposition speed of the second protection layer 315" is faster than that of the first protection layer 315', and besides the silicon nitride film using sputtering, the second protection layer 315" may be formed of an organic insulating layer or a high dielectric oxide film such as hafnium oxide or aluminum oxide.

In addition, another inorganic insulating layer of organic insulating layer may be formed on the second protection layer 315" to make the protection layer 315b have two or more types of dielectric constants and refractive indexes.

As described above, the present invention may be applied for a display device fabricated by using TFTs as well as the LCD device, for example, an organic electroluminescent display device in which an organic electroluminescent element is connected to a driving transistor.

In addition, because the amorphous zinc oxide-based semiconductor material that has a high mobility and can be processed at a low temperature is applied as the active layer, the present invention can be advantageously used for a transparent electronic circuit or a flexible display.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

The invention claimed is:

1. A method for fabricating an oxide thin film transistor, the method comprising:
   forming a gate electrode on a substrate;
   forming a gate insulating layer on the substrate;
   forming first source and drain electrodes on the gate insulating layer;
   forming second source and drain electrodes on the first source and drain electrodes, wherein the second source and drain electrodes are made of titanium or titanium alloy having good bonding force with oxygen; and
   forming an active layer made of amorphous zinc oxide-based semiconductor at an upper portion of the second source and drain electrodes.

2. The method of claim 1, wherein the substrate is formed as a glass substrate or a plastic substrate.

3. The method of claim 1, wherein the active layer is made of amorphous indium gallium zinc oxide (a-IGZO) semiconductor.

4. The method of claim 3, wherein the active layer is formed with a thickness of 500 Å to 1000 Å containing an oxygen density of about 1% to about 20% in a reactive gas during sputtering.

5. The method of claim 4, wherein the a-IGZO semiconductor is formed by using a composite oxide target having atom ratios of 1:1:1, 2:2:1, 3:2:1, 4:2:1 of gallium, indium, and zinc.

6. An oxide thin film transistor (TFT) comprising:
   a gate electrode on a substrate;
   a gate insulating layer on the gate electrode;
   first source and drain electrodes on the gate insulating layer;
   second source and drain electrodes on the first source and drain electrodes, wherein the second source and drain electrodes are made of titanium or titanium alloy having good bonding force with oxygen; and
   an active layer on the second source and drain electrodes comprised of amorphous zinc oxide-based semiconductor.

7. The TFT of claim 6, wherein the substrate is formed as a glass substrate or a plastic substrate.

8. The TFT of claim 6, wherein the active layer comprises amorphous indium gallium zinc oxide (a-IGZO) semiconductor.

9. The TFT of claim 6, wherein the active layer has a thickness of about 500 Å to about 1000 Å containing an oxygen density of about 1% to about 20% in a reactive gas during sputtering.

* * * * *